(12) United States Patent
Nishikawa et al.

(10) Patent No.: US 7,755,136 B2
(45) Date of Patent: Jul. 13, 2010

(54) NONVOLATILE SEMICONDUCTOR MEMORY DEVICE AND METHOD OF MANUFACTURING THE SAME

(75) Inventors: Yukie Nishikawa, Kitakyushu (JP); Akira Takashima, Fuchu (JP); Tatsuo Shimizu, Shinagawa-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 449 days.

(21) Appl. No.: 11/684,757

(22) Filed: Mar. 12, 2007

(65) Prior Publication Data
US 2007/0215924 A1  Sep. 20, 2007

(30) Foreign Application Priority Data
Mar. 13, 2006  (JP)  ............... 2006-067640

(51) Int. Cl.
*H01L 29/788*  (2006.01)
(52) U.S. Cl. .................. 257/321; 257/413; 438/261
(58) Field of Classification Search ................ 257/321, 257/410, 411, 413; 438/261
See application file for complete search history.

(56) References Cited

U.S. PATENT DOCUMENTS

| | | | |
|---|---|---|---|
| 6,630,383 B1 * | 10/2003 | Ibok et al. ................. 438/264 |
| 7,112,543 B2 * | 9/2006 | Ahn et al. ................... 438/783 |
| 7,259,419 B2 * | 8/2007 | Koo et al. ................... 257/314 |
| 7,531,869 B2 * | 5/2009 | Ahn et al. ................... 257/324 |
| 2005/0093079 A1 | 5/2005 | Lee et al. |
| 2005/0275012 A1 * | 12/2005 | Nara et al. .................. 257/324 |

FOREIGN PATENT DOCUMENTS

| | | |
|---|---|---|
| CN | 1713386 A | 12/2005 |
| JP | 11-297867 | 10/1999 |

OTHER PUBLICATIONS

L. Yan, et al., "The effect of ultr-thin $Al_2O_3$ layers on the dielectric properties of $LaAlO_3$ thin film on silicon," Semicond. sci. Technol. 19, 2004, pp. 935-938.

* cited by examiner

*Primary Examiner*—Mark Prenty
(74) *Attorney, Agent, or Firm*—Oblon, Spivak, McClelland, Maier & Neustadt, L.L.P.

(57) ABSTRACT

A memory cell in a nonvolatile semiconductor memory device includes a tunneling insulating film, a floating gate electrode made of a Si containing conductive material, an inter-electrode insulating film made of rare-earth oxide, rare-earth nitride or rare-earth oxynitride, a control gate electrode, and a metal silicide film formed between the floating gate electrode and the inter-electrode insulating film.

26 Claims, 10 Drawing Sheets

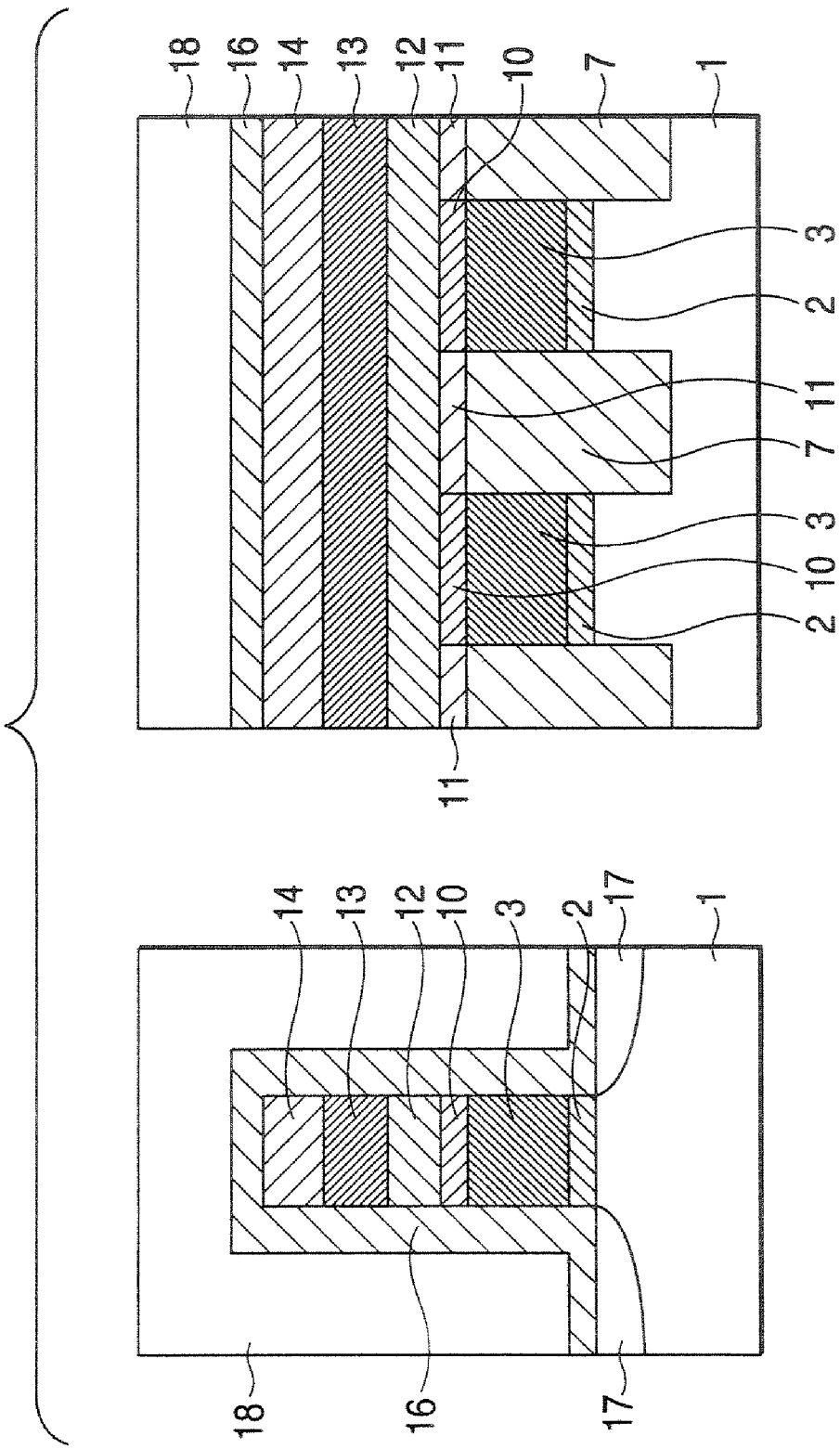

FIG. 10

| CONTROL GATE ELECTRODE (POLYCRYSTALLINE Si) |
|---|
| SiN, $Al_2O_3$ |
| $LaAlO_3$ |
| SiN, $Al_2O_3$ |
| FLOATING GATE ELECTRODE (POLYCRYSTALLINE Si) |

NONVOLATILE SEMICONDUCTOR MEMORY DEVICE AND METHOD OF MANUFACTURING THE SAME

CROSS-REFERENCE TO RELATED APPLICATIONS

This application is based on and claims the benefit of priority from the prior Japanese Patent Application No. 2006-067640, filed on Mar. 13, 2006; the entire contents of which are incorporated herein by reference.

BACKGROUND

1. Technical Field

The present invention relates to a nonvolatile semiconductor memory device which is capable of improving performance of memory cells and reducing leakage current by using high dielectric materials for an inter-electrode insulating film in a stack gate structure having a floating gate electrode, and a method of manufacturing the same.

2. Description of Related Art

An NAND flash memory (one of nonvolatile semiconductor memory devices) will be hereinafter described by way of an example.

A memory cell of an NAND volatile semiconductor memory device has a stack structure in which a tunneling insulating film and a floating gate electrode are formed on a semiconductor substrate and a control gate electrode is formed on the floating gate electrode via an inter-electrode insulating film. In such a memory cell, shift of a threshold voltage, generated by electron injection into the floating gate electrode from a silicon substrate with applying a high electric field to the tunneling insulating film, is used for storage of information. It is desirable that the inter-electrode insulating film has high coupling ratio with high capacitance, and small leakage current.

A method of manufacturing a memory cell of a conventional NAND nonvolatile semiconductor memory device will be described below with reference to FIGS. 6A to 8. Figures in the left and right sides of each of FIGS. 6A to 8 show cross sections perpendicular to each other.

First, an about 7~8 nm thick silicon oxide film 102, which is formed by thermal oxidation as a tunneling insulating film, is formed on a silicon substrate 101 doped with a predetermined impurity, and then, a 60 nm thick phosphorus-doped polycrystalline silicon layer 103 as a floating gate electrode and a mask material 104 for device isolation are sequentially deposited on the silicon oxide film 102 by a chemical vapor deposition (CVD) method. Thereafter, the mask material 104, the polycrystalline silicon layer 103 and the tunneling insulating film 102 are sequentially etched by a reactive ion etching (RIE) method using a resist mask (not shown), and an exposed region of the silicon substrate 101 is etched to form a trench 106 having a depth of 100 nm (FIG. 6A).

Next, a silicon oxide film 107 for device isolation is deposited on the entire surface to fill the trench 106, and then, the silicon oxide film 107 is removed from the surface by a chemical mechanical polishing (CMP) method to planarize the surface, thereby exposing the mask material 104 (FIG. 6B).

After the exposed mask material 104 is selectively etched away, an exposed surface of the silicon oxide film 107 is etched away with a dilute hydrofluoric acid solution and a side wall 108 of the polycrystalline silicon layer 103 is exposed. Then, a $SiO_2/SiN/SiO_2$ film (hereinafter abbreviated as an ONO film) 109 as an inter-electrode insulating film, which has a stack structure of silicon oxide and silicon nitride, is deposited on the entire surface. The equivalent $SiO_2$ thickness of the ONO film is 15 nm or so. At this time, the inter-electrode insulating film 109 is formed on both of the surface and the side wall 108 of the polycrystalline silicon layer 103 three-dimensionaly (FIG. 7A). Since an average dielectric constant of the ONO film 109 is as low as 5 or so, it is necessary to increase effective capacitance by forming the inter-electrode insulating film 109 three-dimensionaly to increase a contact area between the inter-electrode insulating film 109 and the polycrystalline silicon layer 103.

Subsequently, a 100 nm thick conductive layer 110 made of a polycrystalline silicon layer as a control gate electrode is deposited by a CVD method, and then, a mask material 111 for RIE is deposited by a CVD method. Thereafter, the mask material 111, the conductive layer 110, the inter-electrode insulating film 109, the polycrystalline silicon layer 103, and the tunneling insulating film 102 are sequentially etched by RIE using a resist mask (not shown) to form slit regions 112 in a word line direction (FIG. 7B). Thus, shapes of the polycrystalline silicon layer 103 as the floating gate electrode and the conductive layer 110 as the control gate electrode are determined.

Finally, a silicon oxide film 113 is formed on the exposed surface and the electrode side walls by thermal oxidation, and a source and drain regions 114 are formed by an ion implantation method, and then, an inter-layer insulating film 115 is formed by a CVD method to cover the entire surface (FIG. 8). Thereafter, wiring layers and so on are formed by a method known in the related-art to complete the memory cell.

In the above-constructed memory cell of the NAND nonvolatile semiconductor memory device, leakage current flows in the inter-electrode insulating film 109 to the control gate electrode when a high electric field is applied to the inter-electrode insulating film 109 during writing and erasing operations. Since the leakage current obstructs charge storing and erasing in the floating gate electrode via the tunneling insulating film, it is necessary to keep the leakage current lower than the device specification level.

According to wide investigations, it is proved that the leakage current must be less than $1/10$ of the current flow into the tunneling insulating film, just before a writing operation is completed. For example, by assuming that the thickness of the tunneling insulating film is 7.5 nm, a coupling ratio between the tunneling insulating film and the inter-electrode insulating film is 0.6, and the inter-electrode insulating film has a three-dimensional structure, an effective electric field (defined by 'surface charge density/$SiO_2$ dielectric constant') applied to the inter-electrode insulating film is estimated to be 12~18 MV/cm or so.

In that case, an acceptable leakage current density in the inter-electrode insulating film is about $1 \times 10^{-2}$ A/cm².

In order to obtain higher storage capacity of the NAND nonvolatile semiconductor memory device, it is required that the memory device should contain more memory cells, each having miniaturized gate length and gate width. To miniaturize the memory cell, there have been proposed that higher dielectric constant materials (high-k materials) are used for an inter-electrode insulating film, instead of the ONO film that has been conventionally used (see JP-A-11-297867, for example), the reasons for which are as follows.

One of the reasons is that distance between memory cells becomes much smaller in the 50 nm technology node, the inter-electrode insulating film can not be formed three-dimensionaly on the side wall of the floating gate electrode 108, as shown in FIG. 7A.

The miniaturized memory cell should have a so-called plainer cell structure in which the inter-electrode insulating film is formed only on the surface, not on the side walls of the floating gate electrode. The plainer cell structure needs a material having a dielectric constant higher than that of the conventional ONO film. This is because a material having a high dielectric constant can provide high capacitance even if the inter-electrode insulating film is formed in plainer, not in three-dimensionaly.

Another reason is that the plainer cell structure might be applied an effective electric field of about 30 MV/cm to the inter-electrode insulating film, which is twice as high as that of a three-dimensional cell structure. According to a device specification, it is necessary to keep leakage current density in the inter-electrode insulating film lower than $1\times10^{-2}$ A/cm$^2$ even with such a high electric field. The related-art ONO film can not be used as the inter-electrode insulating film in the plainer cell structure since the leakage current suddenly increases in the high electric field. From this standpoint, high-k materials having dielectric constants higher than that of the ONO film should be used as the inter-electrode film. They can suppress the leakage current even with the high electric field by increasing a physical thickness, while the equivalent SiO$_2$ thickness is not increased so much due their high dielectric constants.

Rare-earth oxide, rare-earth nitride and rare-earth oxynitride, etc., which include rare-earth elements, are potential candidates for high-k materials. Since these materials generally have a high electron barrier as well as a high dielectric constant (high-k), it is highly expected that they can be practically used as the inter-electrode insulating film in the plainer cell structure. However, these materials have their inherent problem in the conventional manufacturing method as described below.

As shown in FIGS. 7A and 8, after forming the inter-electrode insulating film, thermal treatment is required to form the control gate electrode and an electrode side wall oxide film. In addition, a thermal treatment is required to activate impurities in the source and drain diffusion regions formed by ion implantation. For example, a rapid thermal treatment is performed for 30 seconds in a temperature range of 900~1000° C. to activate impurities in the source and drain diffusion regions.

FIG. 9 shows change of a LaAlO$_3$ (rare-earth oxide) film structure deposited on silicon substrate after rapid thermal treatment is performed for 30 seconds at the temperature of 900° C. under a nitrogen atmosphere. This condition corresponds to thermal treatment for impurity activation of the source and drain diffusion regions. As can be seen from the right figure of FIG. 9, it is apparent that Si is diffused from the silicon substrate into the LaAlO$_3$ by thermal treatment, LaAlO$_3$ is changed into La silicate containing Al, and the physical thickness of the film rapidly increases. This is because that a metal oxynitride including a rare-earth element such as La is highly reactive with Si.

Accordingly, the dielectric constant of the inter-electrode insulating film formed on the floating gate electrode made of a Si containing conductive material such as polycrystalline silicon decreases with increasing the physical thickness due to large Si diffusion by the above-mentioned rapid thermal treatment, which is required in a device manufacturing process, resulting in large capacitance decrease of the inter-electrode insulating film.

Such deterioration of the inter-electrode insulating film raises a problem of insufficient performance in writing, erasing, reading, and data retaining of the memory cell. In addition, as the dielectric constant decreases, breakdown voltage decreases to 20 MV/cm or so while the leakage current density increases up to $1\times10^{-2}$ A/cm$^2$, which do not satisfy the device specification.

As shown in FIG. 10, in order to suppress such Si diffusion, it may be considered to form barrier layers made of SiN or Al$_2$O$_3$ between a floating gate electrode and an inter-electrode insulating film. Since SiN or Al$_2$O$_3$ has a dielectric constant lower than that of metal oxynitride including rare-earth elements, effective capacitance of the inter-electrode insulating film is reduced, resulting in deteriorating performance of the memory cell.

As described above, there is a serious problem that Si in the silicon substrates or polycrystalline silicon adjacent to the inter-electrode insulating film diffuses in large quantities into the inter-electrode insulating film, which is made of rare-earth oxide, rare-earth nitride or rare-earth oxynitride, by thermal treatment. In particular, the problem is the large quantities of Si diffusion and its uncontrollability.

As rare-earth oxide, rare-earth nitride or rare-earth oxynitride including rare-earth elements with high dielectric constants is used as the inter-electrode insulating film in the memory cell with the floating gate electrode, quality of the inter-electrode insulating film is deteriorated due to the thermal treatment after deposition of the inter-electrode insulating film. Therefore, the dielectric constant is decreased, resulting in deterioration in leakage current characteristics. Accordingly, such a memory device can not achieve high-performances in writing, erasing, reading, and data retaining of the memory cell.

SUMMARY

The present invention has been made in view of the above circumstances and provides a nonvolatile semiconductor memory device and method of manufacturing the same. According to an aspect of the present invention, a nonvolatile semiconductor memory device has good cell operation characteristics and can prevent deterioration of an inter-electrode insulating film of the memory cell without decreasing effective capacitance.

According to a first aspect, a nonvolatile semiconductor memory device comprises memory cells. Each memory cell comprises; a semiconductor region having first conduction type; source and drain regions having second conduction type; a channel region formed between the source and drain regions; isolation regions formed in the semiconductor region; a tunneling insulating film formed on the channel region; a floating gate electrode formed on the tunneling insulating film and made of a Si containing conductive material; a metal silicide film formed on the floating gate electrode; an inter-electrode insulating film formed on the metal silicide film, which is made of rare-earth oxide, rare-earth nitride or rare-earth oxynitride; and a control gate electrode formed on the inter-electrode insulating film.

According to a second aspect, there is provided a method of manufacturing a nonvolatile semiconductor memory device, comprising; stacking a tunneling insulating film and a floating gate electrode layer, which is made of a Si containing conductive material, on a semiconductor region; forming a metal film on a surface of the floating gate electrode layer; siliciding the metal film by thermal treatment; forming a inter-electrode insulating film, which is made of rare-earth oxide, rare-earth nitride or rare-earth oxynitride on the surface of the silicided metal film; forming a control gate electrode on the inter-electrode insulating film; and forming source and drain regions on the semiconductor region.

According to a third aspect of the invention, there is provided a method of manufacturing a nonvolatile semiconductor memory device, comprising: stacking a tunneling insulating film and a floating gate electrode layer made of a Si containing conductive material, on a semiconductor region; forming a metal film on the surface of the floating gate electrode layer; forming a inter-electrode insulating film, which is made of rare-earth oxide, rare-earth nitride or rare-earth oxynitride on the surface of the metal film; forming a control gate electrode on the inter-electrode insulating film; forming source-and drain regions on the semiconductor region; and siliciding the metal film by thermal treatment after forming the inter-electrode insulating film.

According to a fourth aspect, there is provide a method of manufacturing a nonvolatile semiconductor memory device, comprising: stacking a tunneling insulating film and a floating gate electrode layer made of a Si containing conductive material, on a semiconductor region; forming isolation regions on the semiconductor region; forming a metal film on the surfaces of the floating gate electrode layer and the isolation regions simultaneously; siliciding the metal film on the floating gate electrode layer, and insulating the metal film on the isolation regions, simultaneously by thermal treatment; forming a inter-electrode insulating film, which is made of rare-earth oxide, rare-earth nitride or rare-earth oxynitride, on the surfaces of the silicided metal film and the insulated metal film; forming a control gate electrode on the inter-electrode insulating film; and forming source and drain regions on the semiconductor region.

According to a fifth aspect, there is provide a method of manufacturing a nonvolatile semiconductor memory device, comprising: stacking a tunneling insulating film and a floating gate electrode layer that is made of a Si containing conductive material, on a semiconductor region; forming isolation regions on the semiconductor region; forming a metal film on the surfaces of the floating gate electrode layer and the isolation regions simultaneously; forming a inter-electrode insulating film, which is made of rare-earth oxide, rare-earth nitride or rare-earth oxynitride, on the metal film; forming a control gate electrode on an inter-electrode insulating film; forming source and drain regions in the semiconductor region;

siliciding the metal film on the floating gate electrode layer and insulating the metal film on the isolation regions, after forming the inter-electrode insulating layer by thermal treatment.

BRIEF DESCRIPTION OF THE DRAWINGS

In the accompanying drawings;

FIG. 1 is an exemplary cross-sectional view showing a structure of an NAND nonvolatile memory cell according to a first embodiment of the invention;

FIG. 10 is an exemplary cross-sectional view showing a structure of an NAND nonvolatile memory cell manufactured using a related-art method.

DESCRIPTION OF THE EMBODIMENTS

First Embodiment

Figure 2A:
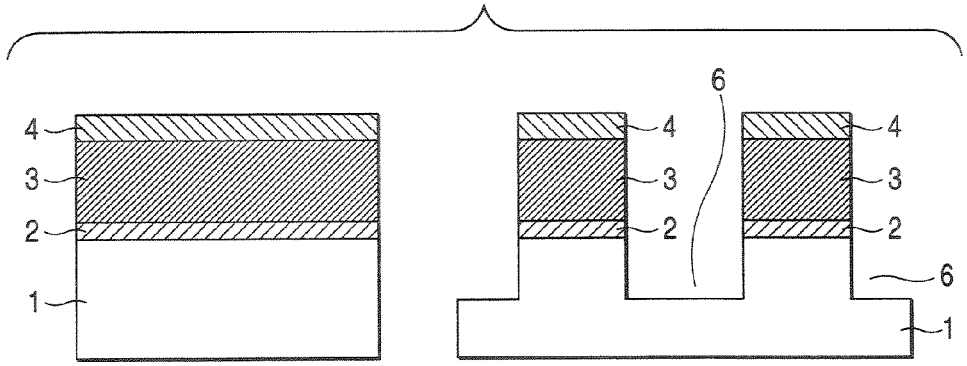
FIGS. 2A and 2B are exemplary cross-sectional views illustrating a process of manufacturing the NAND nonvolatile memory cell according to the first embodiment.
Figure 2B:
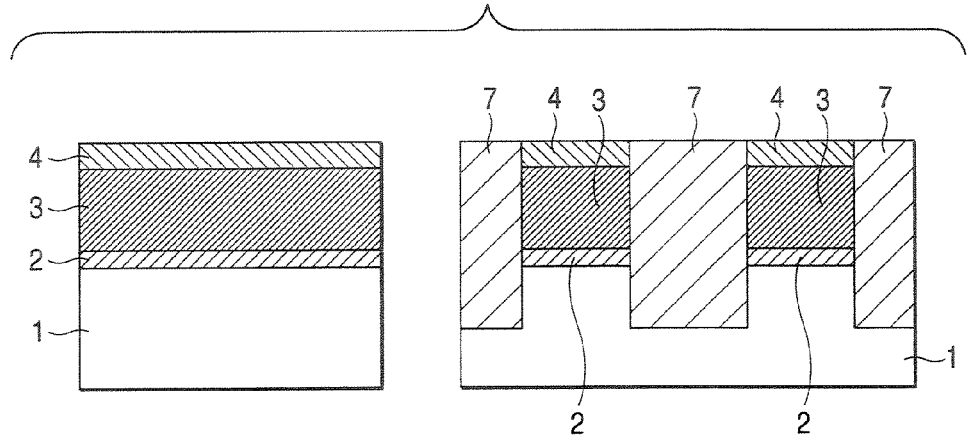

Hereinafter, a structure of a memory cell of an NAND nonvolatile semiconductor memory device according to a first embodiment of the invention will be described with reference to FIG. 1.

An NAND nonvolatile semiconductor memory device comprises bit lines, select gate transistors that interconnect memory cells through the bit lines, the memory-cells connected in series by the bit lines that are placed under the bit liens. FIG. 1 shows cross-sectional structures of a memory cell. The left figure of FIG. 1 is a cross-sectional view in a word line direction. The right figure of FIG. 1 is a cross-sectional view in a direction perpendicular to the word line direction. The right and left figures of FIG. 1 are perpendicular to each other.

As shown in FIG. 1, source-and drain regions 17 doped with predetermined impurities are formed on a silicon substrate 1. An about 6~7 nm thick silicon oxide film 2 as a tunneling insulating film is formed between the source-and drain regions 17 on the silicon substrate 1. On the silicon oxide film 2 are stacked a 40 nm thick phosphorus-doped polycrystalline silicon layer 3 as a floating gate electrode, which is made of a Si containing conductive material, a $SrSi_2$ layer 10 as a metal silicide layer, a $LaAlO_3$ layer 12 as an inter-electrode insulating film, a conductive layer 13 as a control gate electrode having a double-layered structure of a W silicide layer and a polycrystalline Si layer, and a mask material 14 in order. (The mask material 14 may be dispensed with.) Since the $SrSi_2$ layer 10 as the metal silicide layer is conductive, it shows the same operation as the floating gate electrode.

The top surface and side walls of the above stack structure are covered with a silicon oxide film 16. An inter-layer insulating film 18 is formed to cover the entire surface. A channel region, the tunneling insulating film (silicon oxide film 2) and the floating gate electrode (polycrystalline silicon layer 3) are isolated from those of adjacent memory cells by isolation regions 7 of the silicon oxide film. The inter-electrode insulating film ($LaAlO_3$ layer 12) and the control gate electrode (conductive layer 13) are common to memory cells arranged in a bit line direction and extending on the isolation regions 7. In this embodiment, in a region between the inter-electrode insulating film 12 and the isolation regions 7, a metal silicate layer (in this case, a Sr silicate layer 11) is formed as an insulating film including the same metal as the metal silicide layer. The region between the inter-electrode insulating film 12 and the isolation regions 7 must be insulative. This region can be made of silicon oxide which is the same material as the tunneling insulating film and the isolation regions.

Next, a method of manufacturing a memory cell of the NAND nonvolatile memory device shown in FIG. 1 according to the first embodiment will be described with reference to FIGS. 1 and 2A to 4B.

First, the about 6~7 nm thick silicon oxide film 2 as the tunneling insulating film is formed by thermal oxidation on the silicon substrate 1 doped with predetermined impurities, and then, the 40 nm thick phosphorus-doped polycrystalline silicon (Si containing conductive material)layer 3 as the floating gate electrode, the mask material 4 for device isolation are sequentially deposited on the silicon oxide film 2 by a CVD method. Thereafter, the mask material 4, the polycrystalline silicon layer 3 and the silicon oxide film 2 are sequentially etched by a RIE method using a resist mask (not shown), and an exposed region of the silicon substrate 1 is etched to form a trench 6 having a depth of 60 nm (FIG. 2A).

Next, the silicon oxide film 7 as the isolation regions is deposited on the entire surface to fill the trench 6, and then, the silicon oxide film 7 is removed from the surface by a CMP method to planarize the surface with exposing the mask material 4. The material used for the isolation regions is not limited to the silicon oxide film. An insulating material containing silicon and oxygen, for example, a silicon oxynitride film, may be used for the isolation regions.

Next, the exposed mask material 4 is selectively etched away, an exposed surface of the silicon oxide film 7 is etched away with a dilute hydrofluoric acid solution, and the surfaces of the silicon oxide film 7 and the polycrystalline silicon layer 3 are planarized.

Figure 7A:
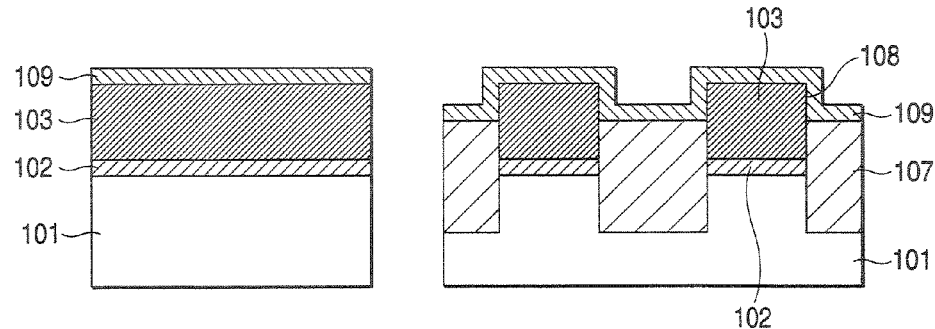
FIGS. 7A and 7B are cross-sectional views illustrating a process of manufacturing a related-art NAND nonvolatile memory cell.
Figure 7B:
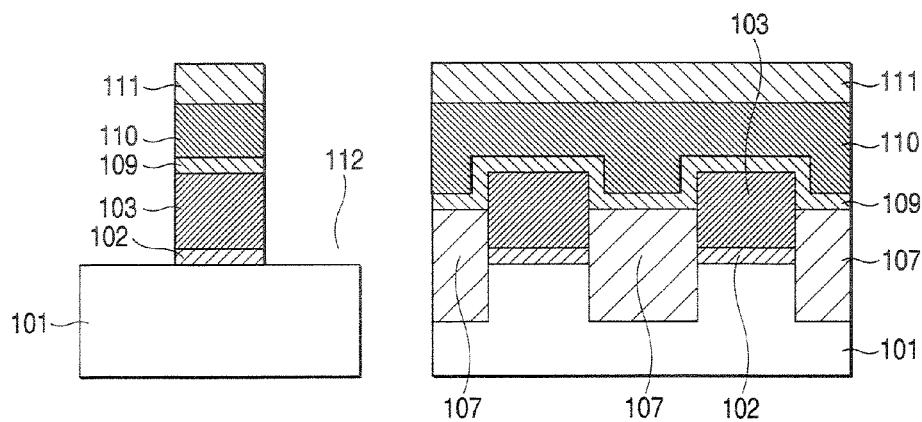
Figure 8:
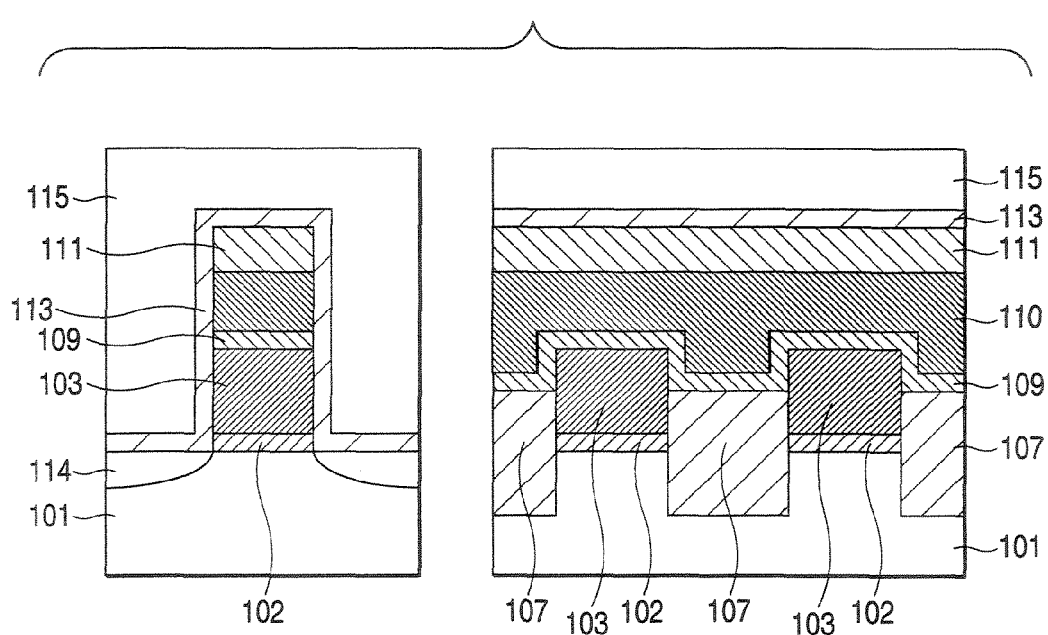
FIG. 8 is an exemplary cross-sectional view illustrating a process of manufacturing a related-art NAND nonvolatile memory cell.
Figure 9:
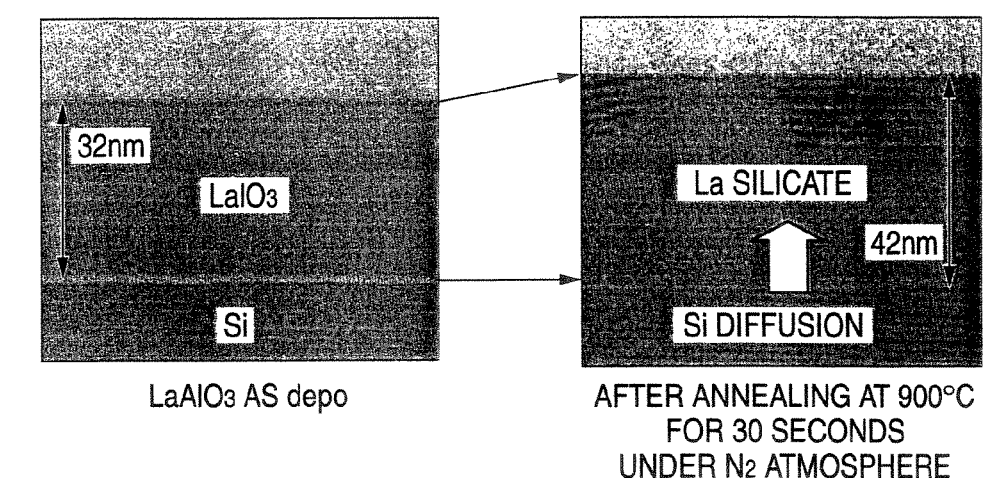
FIG. 9 is an exemplary cross-sectional view illustrating change of a structure of a $LaAlO_3$ film by thermal treatment.

Although the inter-electrode insulating film is formed on the side walls of the polycrystalline silicon layer 103 in the conventional manufacturing method shown in FIG. 7A, in this embodiment, a flat surface may be formed without the side walls since it is possible to sufficiently increase a dielectric constant of the inter-electrode insulating film.

Figure 3A:
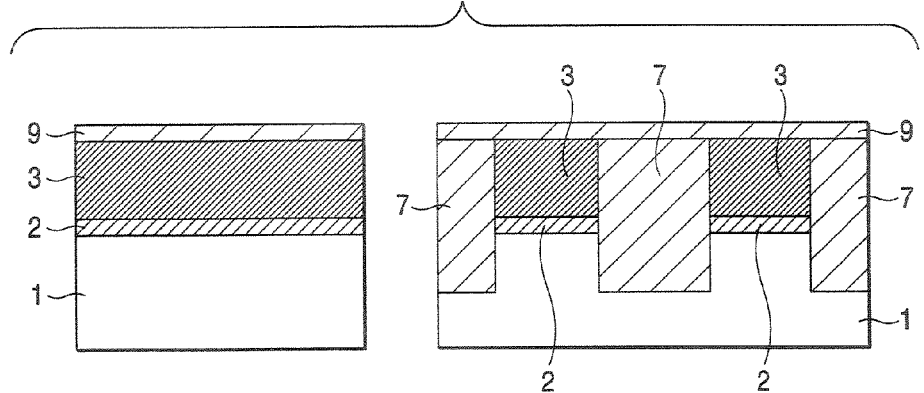
FIGS. 3A and 3B are exemplary cross-sectional views illustrating a process of manufacturing the NAND nonvolatile memory cell according to the first embodiment.

After forming the flat surface, a Sr layer 9 is deposited on the entire surface by the amount of $1.7 \times 10^{15}$ atoms/cm² (the amount of Sr is equivalent to five atomic layers when a SrSi$_2$ layer is formed) at a substrate temperature of 300° C. using a molecular beam epitaxy (MBE) method (FIG. 3A).

In this embodiment, for the Sr deposition, other methods such as a sputtering method, a CVD method, a laser ablation method may be used instead of the MBE method. But, since Sr is easily oxidized, it is necessary to deposit the Sr layer 9 under a vacuum or inert gas atmosphere.

Figure 3B:
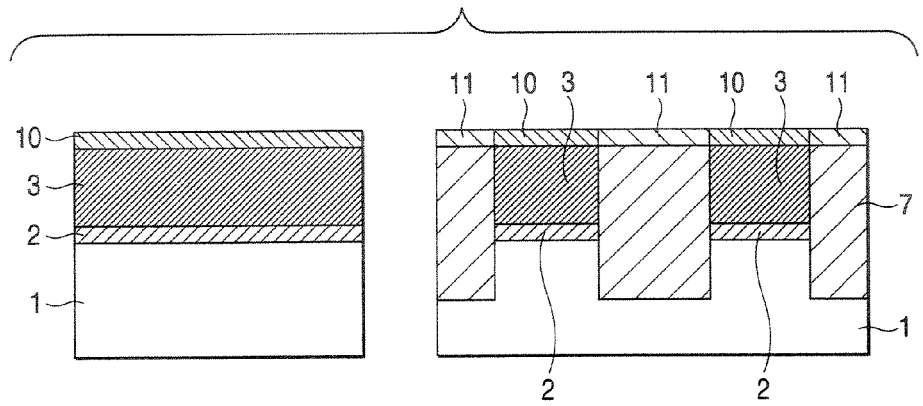

Next, after depositing the Sr layer 9 as a metal layer, thermal treatment is performed at a substrate temperature of 500° C. in a MBE apparatus. With this thermal treatment, as shown in FIG. 3B, Sr deposited on the surface of the polycrystalline silicon layer 3 reacts with Si to form the SrSi$_2$ layer 10 as the metal silicide layer, and Sr deposited on the surface of the silicon oxide film 7 reacts with SiO$_2$ to form the Si silicate layer (having insulating property) as the metal silicate layer in a self-alignment manner. A material used for the isolation regions is not limited to the silicon oxide film. An insulating material containing silicon and oxygen, for example, a silicon oxynitride film, may be used to form a Sr silicate layer (having insulating property) containing nitrogen.

Since Sr and Si bonds are highly thermo-chemically stable, SrSi$_2$ is formed on the Si polycrystalline layer with the following chemical reaction.

$$2Si + Sr \rightarrow SrSi_2 \qquad (1)$$

On the other hand, since Sr has a strong reducing characteristic, Sr reacts with SiO$_2$ with the following chemical reaction.

$$SiO_2 + Sr \rightarrow SiO\uparrow + SrO\uparrow \qquad (2)$$

Since SiO and SrO have a high vapor pressure, some of them is evaporated at a substrate temperature of 500° C. Simultaneously, Sr silicate is formed according to the follow chemical reaction.

$$SiO_2 + Sr \rightarrow Sr\ silicate \qquad (3)$$

It depends on the substrate temperature of which chemical reactions (2) or (3) is dominative in the Sr and SiO$_2$ reaction.

It is proved that the chemical reactions (2) and (3) are almost the same rate at the substrate temperature of 500° C. When the substrate temperature is more than 500° C., the chemical reaction (2) is dominative. When the substrate temperature is less than 500° C., the chemical reaction (3) is dominative. As a temperature for thermal treatment after the Sr deposition is 500° C. in this embodiment, the temperature may be set between 400° C. and 800° C.

Thermal treatment can be done at any temperature between 400° C. and 800° C., and the film formed on the surface of the silicon oxide film 7 contains Sr silicate as its main component. SiO does not remain usually because of its chemical instability, while a small amount of SrO may be mixed rarely in Sr silicate. Particularly when the amount of Sr deposition is small and a high temperature thermal treatment is performed, the chemical reaction (2) is dominative, and accordingly, there may remain no Sr silicate on SiO$_2$. In the case of where Sr silicate is not formed, a step may be formed on side walls of the SrSi$_2$ layer 10. However, this step has no influence on the effects of the invention.

In this embodiment, thickness of the SrSi$_2$ layer 10 formed by the thermal treatment at the temperature of 500° C. is a five atomic layer (about 10 nm in a physical thickness) and it shows metallic (conductive) property. Thickness of the Sr silicate layer 11 is about 7 nm and it shows insulating property.

On the other hand, since the top surface of the polycrystalline silicon layer 3 is silicided, its thickness decreases to 35 nm. Therefore, both of the SrSi$_2$ layer 10 and the polycrystalline silicon layer 3 function as the floating gate electrode and their total thickness is 45 nm.

Figure 4A:
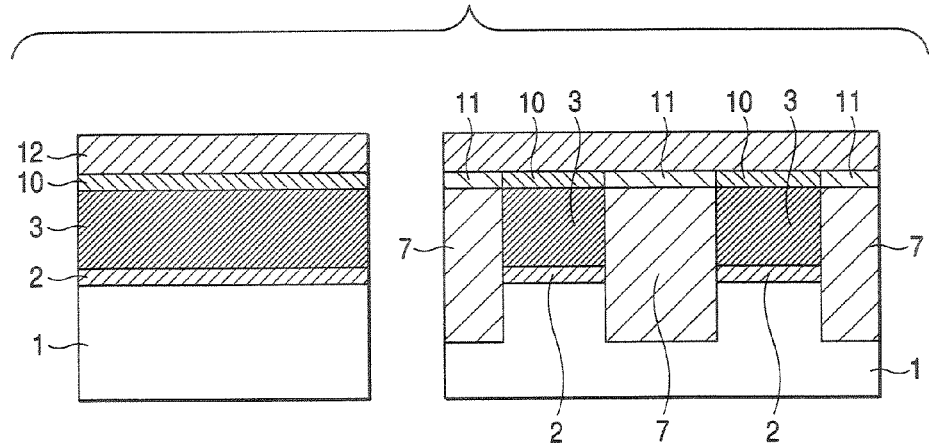
FIGS. 4A and 4B are exemplary cross-sectional views illustrating a process of manufacturing the NAND nonvolatile memory cell according to the first embodiment.

Next, the LaAlO$_3$ layer 12 as the inter-electrode insulating film with thickness of 35 nm is formed using a MBE method, as shown in FIG. 4A. Since a dielectric constant of the LaAlO$_3$ layer 12 is about 25, the equivalent SiO$_2$ thickness (EOT) of the inter-electrode insulating film is about 4 nm. In this embodiment, for the LaAlO$_3$ layer formation, other methods such as a sputtering method, a CVD method, a laser ablation method may be used instead of the MBE method. Since SrSi$_2$ and Sr silicate are thermally stable materials, they are not deformed or changed in their film thickness or their component even when the LaAlO$_3$ layer 12 is deposited under an oxidation atmosphere.

Figure 4B:
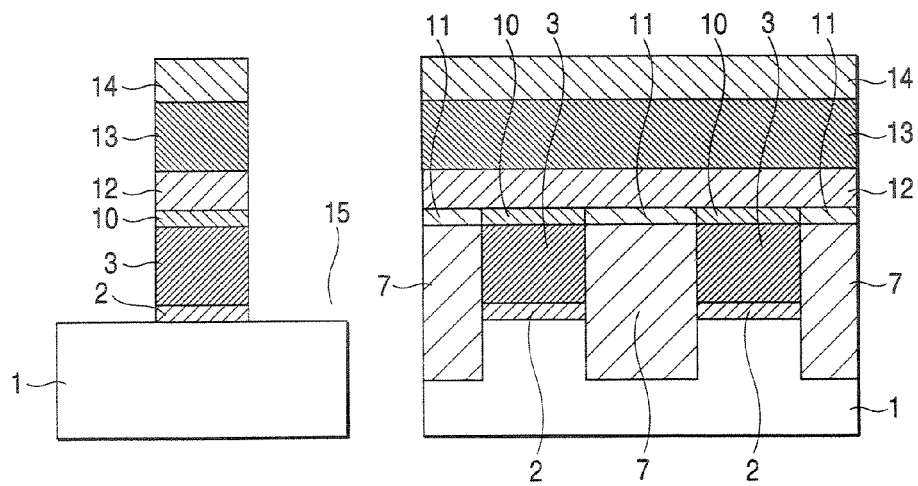

Subsequently, a 100 nm thick conductive layer 13 as the control gate electrode having a double-layered structure of W silicide layer/polycrystalline Si layer is deposited by a CVD method, and then, the mask material 14 for RIE is deposited by a CVD method. Thickness of the W silicide layer is 10 nm. Thereafter, the mask material 14, the conductive layer 13, the LaAlO$_3$ layer 12, the SrSi$_2$ layer 10, the polycrystalline silicon layer 3, and the tunneling insulating film 2 are sequentially etched by the RIE method using a resist mask (not shown) to form slit regions 15 in a word line direction. Thus, regions of the SrSi$_2$ layer 10, the polycrystalline silicon layer 3 and the conductive layer 13 are determined (FIG. 4B).

Finally, as shown FIG. 1, the silicon oxide film 16 is formed on the exposed surface by thermal oxidation, the source and drain regions 17 are formed in the silicon substrate 1 by an ion implantation method, and then, the inter-layer insulating film 18 is formed by a CVD method to cover the entire surface. Thereafter, wiring layers and so on are formed by a method known in the art to complete the nonvolatile memory cell.

Even when the LaAlO$_3$ layer 12 as the inter-electrode insulating film manufactured by the above-described method is thermally treated after formation of the inter-electrode insulating film, it is confirmed that its physical thickness of 25 nm, dielectric constant of 25, and equivalent SiO thickness (EOT) of 4 nm remain unchanged.

It is believed that this is because Si diffusion is suppressed from the polycrystalline silicon layer 3 due to the existence of the SrSi$_2$ layer 10, which is chemically stable metal silicide and is formed between the polycrystalline silicon layer 3 of the floating gate electrode and the LaAlO$_3$ layer 12 of the inter-electrode insulating film.

In addition, the Si diffusion is suppressed from the polycrystalline silicon layer 13 of the control gate electrode due to the W silicide, which is chemically stable metal silicide and is formed adjacent to the inter-electrode insulating film.

In this embodiment, a coupling ratio in the memory cell is as high as 0.6 or more, thereby achieving sufficient performance in writing, erasing, reading and data retaining of the memory cell. A breakdown voltage of the inter-electrode insulating film is as high as 35 MV/m or more, and leakage current density at 30 MV/cm is $1 \times 10^{-3}$ A/cm$^2$, which sufficiently satisfies a device specification.

On the other hand, if the LaAlO$_3$ layer 12 is formed to contact the polycrystalline silicon layer 3 without forming the metal silicide as in the related-art method, a large quantity of Si will diffuse from the polycrystalline silicon layer during post thermal treatment, resulting in component change of LaAlO$_3$ into La silicate. In this case, the physical thickness of the LaAlO$_3$ layer increases to more than 30 nm and the dielectric constant decreases to 12 with increasing the equivalent SiO$_2$ thickness to 10 nm. In addition, a coupling ratio of the memory cell is greatly lowered due to decrease of the effective capacitance of the inter-electrode insulating film, resulting in significant performance deterioration in writing, erasing, reading and data retaining of the memory cell. Moreover, the breakdown voltage decreases to 25 MV/cm or so and the leakage current density increases to $5 \times 10^{-2}$ A/cm$^2$, which do not satisfy the device specification.

In this embodiment, the thickness of the Sr silicide acting as the floating gate electrode is a five atomic layer (about 10 nm) and the thickness of the W silicide forming a portion of the control gate electrode is 10 nm. Si diffusion may not be suppressed if the thickness of a metal silicide layer is less than a one atomic layer. It is experimentally confirmed that Si diffusion can be suppressed as the thickness of the metal silicide layer is more than a two atomic layer. The thickness of the metal silicide layer may be more than a three atomic layer in order to suppress Si diffusion certainly.

Theoretically, there is no upper limit on the thickness of the metal silicide layer. From a standpoint of reliability, a material of the floating gate electrode directly contacting the tunneling insulating film need to be a Si containing conductive material. Most of the floating gate electrode can be formed by metal silicide, while it is necessary that a small region contacting the tunneling insulating film is formed with the Si containing conductive material. In this case, it raises no problem in the memory cell operation and a cell characteristic is also not deteriorated. In the manufacturing method according to this embodiment, a reaction speed in formation of the metal silicate is lower than that of the metal silicide. Therefore, in order to keep thermal budget moderately after metal deposition, it is preferable that the thickness of the metal layer for forming the metal silicide layer is less than a 10 atomic layer.

It has been illustrated in this embodiment that the Sr silicide and the Sr silicate that contain Sr are formed on the polycrystalline silicon layer and the SiO2 layer, respectively, in a self alignment manner. Similarly, the same effect as this embodiment can be obtained when Mg, Ca, or Ba, which is group II alkaline earth metal, is used. Since the group II alkaline earth metal is strongly bonded to Si, metal silicide such as formed SrSi$_2$ is thermo-chemically stable. Embodiments are based on our theoretical prediction using the first principle method.

In addition, a method of selecting metal (M) other than the group II alkaline earth metal, which may be applied to this embodiment, will be described below. Not only a conductive metal silicide is formed on a Si containing conductive material but also an insulating metal silicate is formed on a Si containing insulating material. In addition, it is required that the properties or structures of the metal silicide and the metal silicate are not changed even when rare-earth oxynitride is formed on them under oxidation atmosphere, as follows.

<1> A bonding strength of metal silicide (M-Si$_x$) should be larger than that of metal oxide (M-O$_x$). That is, the metal silicide should be thermo-chemically more stable than the metal oxide. Specifically, formation energy (ΔH) of the metal silicide per Si atom may be smaller than −20 kcal/(metal atom) and formation energy (ΔG) of the metal oxide must be larger than −800 kJmol$^{-1}$. In this embodiment, in order to make the metal silicide thermo-chemically stable, it is required that ΔH should be smaller than −20 kcal/(metal atom). Regarding ΔG, since formation energy of SiO$_2$ is about −800 kJmol$^{-1}$, the formation energy of metal oxide should be larger than that of SiO$_2$.

<2> Metal silicide (M-Si$_x$) should be a conductive material (resistivity: ρ<100 μΩcm) and metal oxide (M-O$_x$) should be an insulating material (ρ>100 μΩcm).

<3> Metal (M) should have a small diffusion constant in Si and oxynitride.

The present inventors have found that metals satisfying the above requirements are Mo, W, Co, Ni, Pt and Pd. That is, it means that the same effect as this embodiment can be obtained when the metal selected from Mg, Ca, Sr, Ba, Mo, W, Co, Ni, Pt and Pd is used.

Next, an effect of a work function of a metal silicide layer on a memory cell characteristic will be considered. The present inventors have theoretically calculated that a work function of the metal silicide layer including Mg, Ca, Sr and Ba (the group II alkaline earth metal) is 3.8~4.0 eV, which is substantially equal to the work function of n$^+$ type polycrystalline silicon.

Since a Schottky barrier is not formed between the such metal silicide and the n$^+$ type Si containing conductive material, a coupling ratio of the memory cell, as well as a writing/erasing characteristic is not affected. In this respect, the group II alkaline earth metals are appropriate for forming the floating gate electrode.

Work functions of metal silicides of Mo, W and Co are 4.5~4.6 eV near the center of the Si forbidden energy band gap and have little effect on the coupling ratio. On the other hand, since work functions of metal silicides of Ni, Pd and Pt are as large as 4.7~5.0 eV, the coupling ratio is likely to be decreased due to the Schottky barrier formed between the metal silicides and the n$^+$ type Si containing conductive material. In order to make this effect as small as possible, it is effective to set the impurity concentration of the $n^+$ type Si containing conductive material to be high enough(above $5 \times 10^{19}$ cm$^{-3}$).

As the polycrystalline silicon (typically, $n^+$ type polycrystalline silicon) is used for the floating gate electrode in this embodiment, the other Si containing conductive materials may also be used for the floating gate electrode. Here, the Si containing conductive material refers to a semiconductor material containing Si as a main component and dopants as impurity. The SiGe material containing Si and additional Ge can be used as the Si containing conductive material, and the stable metal silicide is also formed on the SiGe layer. Since the Si containing conductive material is used for the layer adjacent to the tunneling insulating film, high reliability of the tunneling insulating film can be achieved.

In addition, in this embodiment, the isolation regions are made of silicon oxide. Not only silicon oxide but also the other Si containing insulative materials such as SiON may be used for the isolation regions. In addition, if metal nitride has insulating property, Si nitride may be used as an insulating material. In addition, an insulating material containing Ge in addition to Si (SiGeOx, SiGeON) may be used for the isolation regions.

In this embodiment, the control gate electrode comprises the metal silicide (W silicide) and the Si containing conductive material (polycrystalline silicon). When the Si containing conductive material is used for a part of the control gate electrode, Si diffusion can be suppressed by inserting the chemically stable metal silicide, which is selected with the same criterion as the floating gate silicide contacting the inter-electrode insulating film, as shown in this embodiment. However, it is not necessary to use the Si containing conductive material for the control gate electrode. It is possible to use any other materials such as metal, metal silicide, conductive metal nitride, conductive metal oxide, and any stacking structure of them.

In this embodiment, LaAlO$_3$ is used for the inter-electrode insulating film. Moreover, other rare-earth oxide, rare-earth nitride or rare-earth oxynitride containing rare-earth elements may be used for the inter-electrode insulating film. (A rare-earth element refers to 17 elements of La, Ce, Pr, Nd, Pm, Sm, Eu, Gd, Tb, Dy, Ho, Er, Tm, Yb, Lu, Sc and Y.) In order to use these materials containing the rare-earth elements for the inter-electrode insulating film, it is preferable that these materials have a dielectric constant of equal or more than 15 and equal or less than 30. This is because that decrease of leakage current can not be obtained if the dielectric constant is too small. On the other hands, an inter-memory cell interference may be raised if the dielectric constant is too large. In addition, it is preferable that the electron barrier height of the inter-electrode insulating film is high enough in order to reduce leakage current.

Examples of rare-earth oxide satisfying above requirements may include Y$_2$O$_3$, La$_2$O$_3$, Pr$_2$O$_3$, etc. It is possible to increase moisture resistance of La$_2$O$_3$ and Pr$_2$O$_3$ by adding at least one element selected from Al, Si, Ti, Zr, Hf and Ta to rare-earth oxynitride or the rare-earth oxide.

Although the addition of different elements causes decrease in the dielectric constant of the rare-earth oxide and oxynitride, the requirement that the dielectric constant should be within a range of 15-30 can be satisfied by adjusting the amount of addition due to the high dielectric constants of the rare-earth oxide and oxynitride.

In addition, Si content of the rare-earth oxynitride with a pre-controlled amount has no effect on a film characteristic. If Si is contained in the rare-earth oxynitride within several to several tens %, the hygroscopic property of the rare-earth oxynitride may be suppressed.

The thermal treatment process of siliciding the metal film is performed after the metal film formation process and before the inter-electrode insulating formation process in this embodiment. The silicidation process is not prevented even when the thermal treatment process is performed after forming the inter-electrode insulating film on the metal film. In this case, the same effect as this embodiment can be obtained. The thermal treatment for siliciding the metal film may be performed independently or in combine with the other thermal treatments after forming the inter-electrode insulating.

However, it is preferable that the thermal treatment of siliciding the metal film is performed before a thermal treatment process with a high temperature condition, for example, at 900~1000° C.

Second Embodiment

Hereinafter, a structure of a memory cell of an NAND nonvolatile semiconductor memory device and a method of manufacturing the same according to a second embodiment of the invention will be described with reference to FIG. 5.

Figure 5:
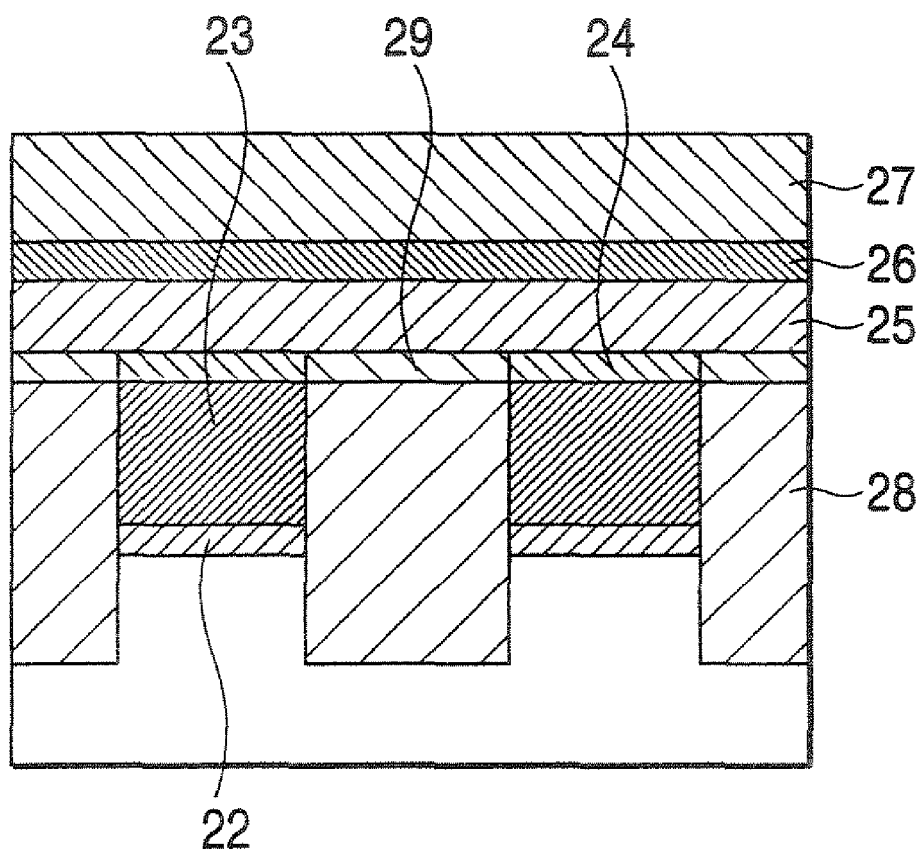
FIG. 5 is an exemplary cross-sectional view illustrating a process of manufacturing an NAND nonvolatile memory cell according to a second embodiment of the invention.
Figure 6A:
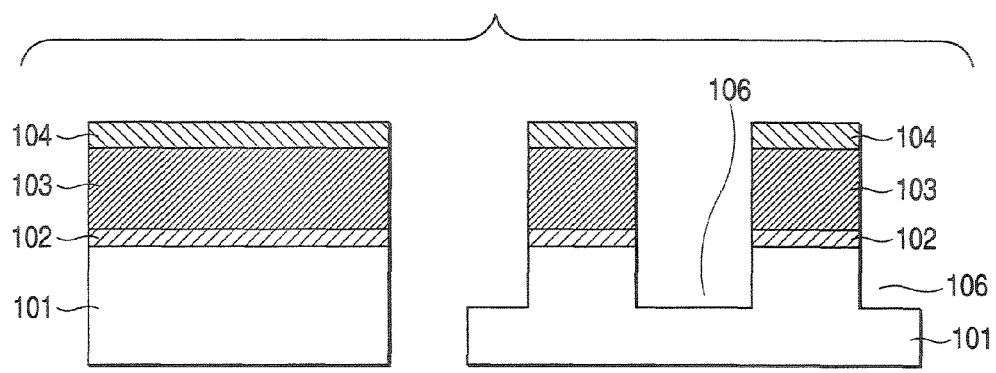
FIGS. 6A and 6B are cross-sectional views illustrating a process of manufacturing a related-art NAND nonvolatile memory cell.
Figure 6B:
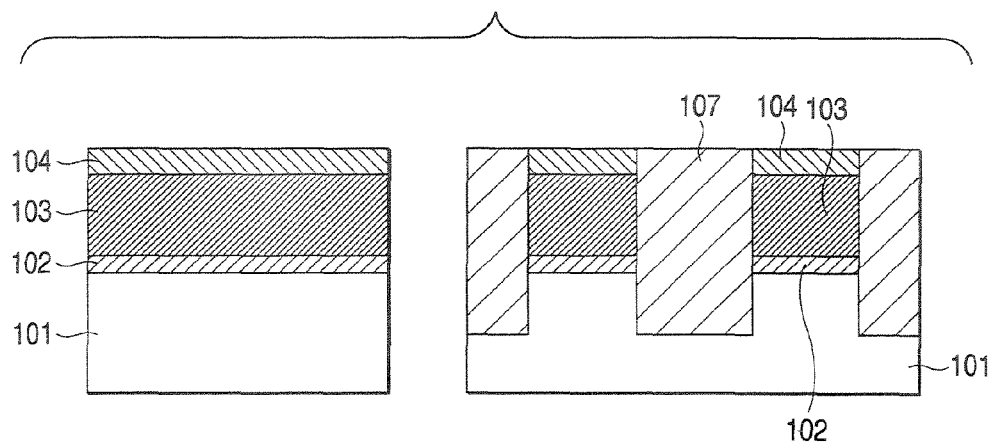

FIG. 5 is a cross-sectional view in a direction perpendicular to a word line of a memory cell.

As shown in FIG. 5, source and drain regions (not shown) are formed on a silicon substrate 21 doped with predetermined impurities therein. An about 6~7 nm thick silicon oxide film 22 as a tunneling insulating film is formed between the source and drain regions on the silicon substrate 21. On the silicon oxide film 22 are stacked a 40 nm thick polycrystalline silicon layer 23 as a floating gate electrode, which is made of a Si containing conductive material, a WSi$_2$ layer 24 as a metal silicide layer, a LaHfON layer 25 and a HfAlO$_x$ layer 26 as an inter-electrode insulating film, and a conductive layer 27 as a control gate electrode having a double-layered structure of a WN layer and a W layer (the WN layer being formed on the inter-electrode insulating film) in order. Since the WSi$_2$ layer 24 as the metal silicide layer is, it shows the same operation as the floating gate electrode like the polycrystalline silicon layer 23.

The top surface and side walls of the above stack structure are covered with a silicon oxide film like the first embodiment. An inter-layer insulating film is formed to cover the entire surface. A channel region, the tunnel insulating film (silicon oxide film 22) and the floating gate electrode (polycrystalline silicon layer 23) are isolated from those of adjacent memory cells by isolation regions, which are made of a silicon oxide film 28. The inter-electrode insulating film (LaHfON layer 25 and HfAlO$_x$ layer 26) and the control gate electrode (conductive layer 27) are common to memory cells arranged in a bit line direction and extend on the isolation regions 28. According to a method to be described later, a W silicate layer 29 of a metal silicate layer is formed in a region between the inter-electrode insulating film (LaHfON layer 25 and HfAlO$_x$ layer 26) and the isolation regions 28. There must be formed insulating materials in the region between the inter-electrode insulating film and the isolation regions 28, such as silicon oxide, same as the isolation regions.

The memory cell as constructed above is manufactured according to the substantially same method as the first embodiment.

First, the tunneling insulating film 22 is formed on a p type silicon substrate 21 by thermal oxynitridation, and then, a 30 nm thick phosphorus-doped polycrystalline silicon layer 23 as the floating gate electrode and a mask material for device isolation are sequentially deposited on the tunneling insulating film 22 by a CVD method. Thereafter, the mask material, the polycrystalline silicon layer 23 and the tunneling insulating film 22 are sequentially etched by a RIE method using a resist mask, and an exposed region of the silicon substrate 21 is etched to form a trench having a depth of 60 nm.

Next, the silicon oxide film 28 for the device isolation is deposited on the entire surface to fill the trench, and then, the silicon oxide film 28 is removed from the surface by a CMP method to planarize the surface. After an exposed mask material is selectively etched away, an exposed surface of the silicon oxide film 28 is etched away with a dilute hydrofluoric acid solution, and surfaces of the silicon oxide film 28 and the polycrystalline silicon layer 23 are planarized.

After forming a flat surface, W as a metal layer is deposited on the entire surface by the amount of $1.7 \times 10^{15}$ atoms/cm$^2$ (the amount of W is equivalent to five atomic layers when a WSi$_2$ layer is formed) at a substrate temperature of 200° C. using a CVD method. In this embodiment, for the W deposition, other methods such as a sputtering method, an MBE method, a laser ablation method may be used instead of the CVD method.

Next, after depositing W as the metal layer, a thermal treatment is performed at a substrate temperature of 1000° C. in a rapid thermal processing apparatus. With this thermal treatment, W deposited on the surface of the silicon oxide film 28 reacts with SiO$_2$ to form the W silicate layer 29 in a self-alignment manner. The W silicide layer 24 with a thickness of a five atomic layer (about 10 nm in a physical thickness) shows metallic property (resistivity: $\rho=70$ $\mu\Omega$cm). On the other hand, the W silicate layer 29 with a thickness of about 5 nm shows insulative property.

Next, the LaHfON layer 25 as the inter-electrode insulating film is formed with a physical thickness of 15 nm, and then, the HfAlO$_x$ layer 26 with a physical thickness of 15 nm is formed using a sputtering method. Although La$_2$O$_3$ is an instable material having hygroscopic property, it can be thermo-chemically stabilized by adding Hf and N to La$_2$O$_3$ (LaHfON). A material added to the rare-earth oxynitride may be selected from Al, Si, Ti, Zr, Hf and Ta. Since dielectric constants of LaHfON and HfAlO$_x$ are about 30 and 20, respectively, the equivalent SiO$_2$ thickness (EOT) of the inter-electrode insulating film is about 5 nm. In this embodiment, for the LaHfON and HfAlO$_x$ formation, other methods such as an MBE method, a CVD method, a laser ablation method, may be used instead of the sputtering method.

As shown in this embodiment, the inter-electrode insulating film need not have a single-layered structure of a rare-earth oxynitride film, a rare-earth oxide film or a rare-earth nitride film, but may have a stack structure with other high dielectric constant films, an oxide film or a nitride film.

In order to decrease leakage current using a high electron barrier of the material including rare-earth elements, it is necessary to form rare-earth oxynitride in contact with the floating gate electrode. At that time, the metal silicide must be formed between the rare-earth oxynitride and the Si containing conductive material of the floating gate electrode. Accordingly, even when other high dielectric materials are stacked on the deposited rare-earth oxynitride film, rare-earth oxide film or rare-earth nitride film, the effects of the invention remain unchanged.

Subsequently, a 100 nm thick conductive layer 27 as the control gate electrode having a double-layered structure of WN/W layers is deposited by a CVD method, and then, the mask material for RIE is deposited by a CVD method. Thereafter, the mask material, the conductive layer 27, the inter-electrode insulating films 25 and 26, the metal silicide film 24, the floating gate electrode 23, and the tunneling insulating film 22 are sequentially etched by a RIE method using a resist mask to form slit regions in a word line direction.

Finally, a silicon oxide film is formed on an exposed surface by thermal oxidation, a source and drain diffusion regions are formed by an ion implantation method, and then, an inter-layer insulating film is formed by a CVD method to cover the entire surface to complete the memory cell as shown in FIG. 5.

Even when the LaHfON/HfAlO$_x$ layers as the inter-electrode insulating film manufactured by the above-described method is treated thermally after formation of the inter-electrode insulating film, it is confirmed that its physical thickness of 30 nm and the equivalent SiO$_2$ thickness (EOT) of 5 nm remain unchanged. Si diffusion is completely suppressed from the polycrystalline silicon layer of the floating gate electrode, since the chemically stable metal silicide (W silicide) is formed adjacent to the floating gate electrode and the inter-electrode insulating film. A coupling ratio of the memory cell is as high as 0.6 or more, thereby achieving sufficient performance in writing, erasing, reading and data retaining of the memory cell. A breakdown voltage of the inter-electrode insulating film is as high as 35 MV/m or more and leakage current density at 30 MV/cm is $2 \times 10^{-3}$ A/cm$^2$, which sufficiently satisfies a device specification.

On the other hand, if LaHfON is formed adjacent to the polycrystalline silicon layer without forming the metal silicide as in the conventional method, a large quantity of Si is diffused from the polycrystalline silicon layer during a post thermal treatment, resulting in change of LaHfON into LaHf silicate. In this case, the physical thickness of the LaHfON layer increases to more than 40 nm, while the dielectric constant decreases to 15 with increasing the equivalent SiO$_2$ thickness to 12 nm. In addition, a coupling ratio of the memory cell is greatly lowered due to decrease of the effective capacitance of the inter-electrode insulating film, resulting in significant deterioration of device characteristics of writing, erasing, reading and data retaining of the memory cell. In addition, a breakdown voltage decreases to 20 MV/cm or so and leakage current density increases to $3 \times 10^{-2}$ A/cm$^2$, which do not satisfy a device specification.

In this embodiment, the control gate electrode is formed of a double layer of WN and W. If a Si containing conductive material is not used for the control gate electrode, the metal silicide may not be used in a contact region between the control gate electrode and the inter-electrode insulating film. In order to decrease leakage current, it is preferable that a work function of the control gate electrode is high. WN having a function of 4.8~4.9 eV is suitable for the control gate electrode.

The NAND flash memory which is representative of nonvolatile memory devices has been illustrated in the above embodiments. Moreover, the invention can be applied to other different types of nonvolatile memory cells having an insulating film contacting a gate electrode, such as NOR, AND, DINOR, NANO memory cells and so on.

According to the above embodiments, when the inter-electrode insulating film containing rare-earth elements is used in the memory cell with the floating gate electrode, the chemically stable metal silicide film is formed between the inter-electrode insulating film and the Si containing conductive material of the floating gate electrode. In addition, the chemically stable metal silicide film shows the same operation as the floating gate electrode and, at the same time, suppresses Si diffusion from the floating gate electrode. Accordingly, quality of the inter-electrode insulating film is prevented from being deteriorated, resulting in achievement of a nonvolatile semiconductor memory device with a high dielectric constant and good cell operation characteristics.

According to the above embodiments, since the conductive metal silicide layer on the floating gate electrode and the insulative metal silicate layer containing the same kind metal with that in the metal silicide layer on the isolation regions can be formed in a self-alignment manner, a nonvolatile semiconductor memory device related to the invention can be manufactured through a simple process.

According to the above embodiments, the inter-electrode insulating film made of rare-earth oxide, rare-earth nitride, or rare-earth oxynitride is used in the memory cell having the floating gate electrode. Since the chemically stable metal silicide film is formed between the inter-electrode insulating film and the Si containing conductive material of the floating gate electrode, quality of the inter-electrode insulating film is prevented from being deteriorated, thereby achieving a nonvolatile semiconductor memory device with a high dielectric constant and good cell operation characteristics.

What is claimed is:

1. A nonvolatile semiconductor memory device with memory cells, each memory cell comprising;
   a semiconductor region having first conduction type;
   source and drain regions having second conduction type;
   a channel region formed between the source and drain regions;
   isolation regions formed in the semiconductor region;
   a tunneling insulating film formed on the channel region;
   a floating gate electrode formed on the tunneling insulating film, and made of a Si containing conductive material;
   a metal silicide film formed on the floating gate electrode;
   an inter-electrode insulating film formed on the metal silicide film, and made of rare-earth oxide, rare-earth nitride or rare-earth oxynitride; and
   a control gate electrode formed on the inter-electrode insulating film, wherein
   the thickness of the metal silicide film is equal to or more than a 3 atomic layer, and equal to or less than a 10 atomic layer.

2. A nonvolatile semiconductor memory device with memory cells, each memory cell comprising;
   a semiconductor region having first conduction type;
   source and drain regions having second conduction type;
   a channel region formed between the source and drain regions;
   isolation regions formed in the semiconductor region;
   a tunneling insulating film formed on the channel region;
   a floating gate electrode formed on the tunneling insulating film, and made of a Si containing conductive material;
   a metal silicide film formed on the floating gate electrode;
   an inter-electrode insulating film formed on the metal silicide film, and made of rare-earth oxide, rare-earth nitride or rare-earth oxynitride; and
   a control gate electrode formed on the inter-electrode insulating film,
   wherein the inter-electrode insulating film extends on the isolation regions, and wherein an insulating film including the same metal as that included in the metal silicide film is formed between the inter-electrode insulating film and the isolation regions.

3. The nonvolatile semiconductor memory device according to claim 1, wherein the metal silicide film includes one or more elements selected from Mg, Ca, Sr, Ba, Mo, W, Ni, Co, Pt and Pd.

4. The nonvolatile semiconductor memory device according to claim 2, wherein the thickness of the metal silicide film is equal to or more than a 3 atomic layer, and equal to or less than a 10 atomic layer.

5. The nonvolatile semiconductor memory device according to claim 1, wherein the inter-electrode insulating film includes one or more elements of rare-earth metals and one or more elements selected from Al, Si, Ti, Zr, Hf and Ta.

6. The nonvolatile semiconductor memory device according to claim 2, wherein the insulating film is a silicate film including the same metal as that including in the metal silicide film.

7. A method of manufacturing a nonvolatile semiconductor memory device according to claim 1, comprising;
   stacking a tunneling insulating film and a floating gate electrode layer, which is made of a Si containing conductive material, on a semiconductor region;
   forming a metal film on a surface of the floating gate electrode layer;
   siliciding the metal film by thermal treatment;
   forming an inter-electrode insulating film made of a rare-earth oxide , a rare-earth nitride or a rare-earth oxynitride on a surface of the silicided metal film;
   forming a control gate electrode on the inter-electrode insulating film; and
   forming source and drain regions on the semiconductor region.

8. The method according to claim 7, wherein the metal film is silicided at a temperature between 400° C. and 800° C.

9. A method of manufacturing a nonvolatile semiconductor memory device according to claim 1, comprising:
   stacking a tunneling insulating film and a floating gate electrode layer, which is made of a Si containing conductive material, on a semiconductor region;
   forming a metal film on a surface of the floating gate electrode layer;
   forming an inter-electrode insulating film made of a rare-earth oxide , a rare-earth nitride or a rare-earth oxynitride on the surface of the metal film;
   forming a control gate electrode on the inter-electrode insulating film;
   forming source and drain regions on the semiconductor region; and
   siliciding the metal film by thermal treatment after forming the inter-electorode insulating film.

10. The method according to claim 7, wherein the metal film includes one or more elements selected from Mg, Ca, Sr, Ba, Mo, W, Co, Ni, Pt and Pd.

11. The method according to claim 9, wherein the metal film includes one or more elements selected from Mg, Ca, Sr, Ba, Mo, W, Co, Ni, Pt and Pd.

12. The method according to claim 7, wherein the inter-electrode insulating film includes one or more elements of rare-earth metals and one or more elements selected from Al, Si, Ti, Zr, Hf and Ta.

13. The method according to claim 9, wherein the inter-electrode insulating film includes one or more elements of rare-earth metals and one or more elements selected from Al, Si, Ti, Zr, Hf and Ta.

14. A method of manufacturing a nonvolatile semiconductor memory device according to claim 1, comprising:
   stacking a tunneling insulating film and a floating gate electrode layer, which is made of a Si containing conductive material, on a semiconductor region;
   forming isolation regions on the semiconductor region;
   forming a metal film on surfaces of the floating gate electrode layer and the isolation regions simultaneously;

siliciding the metal film on the floating gate electrode layer, and insulating the metal film on the isolation regions, simultaneously by thermal treatment;

forming a inter-electrode insulating film, which is made of a rare-earth oxide, a rare-earth nitride or a rare-earth oxynitride on the surface of the silicided metal film and the insulated metal film;

forming a control gate electrode on the inter-electrode insulating film; and forming source and drain regions on the semiconductor region.

15. The method according to claim 14, wherein the metal film is silicided at a temperature of between 400° C. and 800° C.

16. A method of manufacturing a nonvolatile semiconductor memory device according to claim 1, comprising:

stacking a tunneling insulating film and a floating gate electrode layer, which is made of a Si containing conductive material, on a semiconductor region;

forming isolation regions on the semiconductor region;

forming a metal film on surfaces of the floating gate electrode layer and the isolation regions simultaneously;

forming an inter-electrode insulating film made of a rare-earth oxide, a rare-earth nitride or a rare-earth oxynitride on the metal film;

forming a control gate electrode on the inter-electrode insulating film;

forming source and drain regions on the semiconductor region;

siliciding the metal film on the floating gate electrode layer after forming the inter-electrode insulating film by thermal treatment; and insulating the metal film on the isolation regions by thermal treatment.

17. The method according to claim 14, wherein the metal film includes one or more elements selected from Mg, Ca, Sr, Ba, Mo, W, Co, Ni, Pt and Pd.

18. The method according to claim 16, wherein the metal film includes one or more elements selected from Mg, Ca, Sr, Ba, Mo, W, Co, Ni, Pt and Pd.

19. The method according to claim 14, wherein the inter-electrode insulating film includes one or more elements of rare-earth metals and one or more elements selected from Al, Si, Ti, Zr, Hf and Ta.

20. The method according to claim 16, wherein the inter-electrode insulating film includes one or more elements of rare-earth metals and one or more elements selected from Al, Si, Ti, Zr, Hf and Ta.

21. The method according to claim 14, wherein the isolation regions are made of silicon oxide or silicon oxynitride, and wherein the insulating metal film formed by the thermal treatment is a metal silicate film.

22. The method according to claim 16, wherein the isolation regions are silicon oxide or silicon oxynitride, and wherein the insulating metal film formed by the thermal treatment is a metal silicate film.

23. The nonvolatile semiconductor memory device according to claim 1, wherein the inter-electrode insulating film extends on the isolation regions, and wherein an insulating film including the same metal as that included in the metal silicide film is formed between the inter-electrode insulating film and the isolation regions.

24. The nonvolatile semiconductor memory device according to claim 23, wherein the insulating film is a silicate film including the same metal as that including in the metal silicide film.

25. The nonvolatile semiconductor memory device according to claim 2, wherein the metal silicide film includes one or more elements selected from Mg, Ca, Sr, Ba, Mo, W, Ni, Co, Pt and Pd.

26. The nonvolatile semiconductor memory device according to claim 2, wherein the inter-electrode insulating film includes one or more elements of rare-earth metals and one or more elements selected from Al, Si, Ti, Zr, Hf and Ta.

* * * * *